(12) United States Patent
Yasuda et al.

(10) Patent No.: US 9,881,874 B2
(45) Date of Patent: Jan. 30, 2018

(54) FORMING METHOD OF SUPERPOSITION CHECKING MARK, MANUFACTURING METHOD OF A SEMICONDUCTOR DEVICE AND SEMICONDUCTOR DEVICE

(71) Applicant: Toshiba Memory Corporation, Minato-ku (JP)

(72) Inventors: Kenichi Yasuda, Yokkaichi (JP); Shinya Arai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/057,406

(22) Filed: Mar. 1, 2016

(65) Prior Publication Data

US 2017/0154852 A1    Jun. 1, 2017

Related U.S. Application Data

(60) Provisional application No. 62/261,449, filed on Dec. 1, 2015.

(51) Int. Cl.
| | |
|---|---|
| H01L 29/06 | (2006.01) |
| H01L 23/544 | (2006.01) |
| H01L 21/033 | (2006.01) |
| H01L 21/768 | (2006.01) |
| H01L 27/11582 | (2017.01) |
| H01L 21/28 | (2006.01) |
| H01L 21/66 | (2006.01) |
| H01L 21/027 | (2006.01) |

(52) U.S. Cl.
CPC ........ *H01L 23/544* (2013.01); *H01L 21/0274* (2013.01); *H01L 21/0332* (2013.01); *H01L 21/28282* (2013.01); *H01L 21/7682* (2013.01); *H01L 21/76877* (2013.01); *H01L 22/20* (2013.01); *H01L 27/11582* (2013.01); *H01L 2223/54426* (2013.01)

(58) Field of Classification Search
USPC ... 257/622, E23.02, E21.274, 781, 782, 786, 257/797, E23.179, E21.245, E21.486; 438/113, 462, 689; 365/399
See application file for complete search history.

(56) References Cited

U.S. PATENT DOCUMENTS

| | | | |
|---|---|---|---|
| 8,790,851 B2 | 7/2014 | Okamoto et al. | |
| 9,123,690 B1 * | 9/2015 | Ratnadurai | .......... H01L 29/408 |

FOREIGN PATENT DOCUMENTS

| | | |
|---|---|---|
| JP | 63-271979 | 11/1988 |
| JP | 6-275485 | 9/1994 |
| JP | 5696079 | 4/2015 |
| WO | WO 99/08314 A1 | 2/1999 |

* cited by examiner

*Primary Examiner* — Tram H Nguyen
(74) *Attorney, Agent, or Firm* — Oblon, McClelland, Maier & Neustadt, L.L.P.

(57) ABSTRACT

According to one embodiment, a forming method of superposition checking marks includes forming a first superposition checking mark to have a first step with respect to an arrangement surface for the first superposition checking mark, forming an opaque film having a second step resulting from the first step on the arrangement surface, and forming on the opaque film a second superposition checking mark provided with a transparent film allowing observation of the second step.

5 Claims, 11 Drawing Sheets

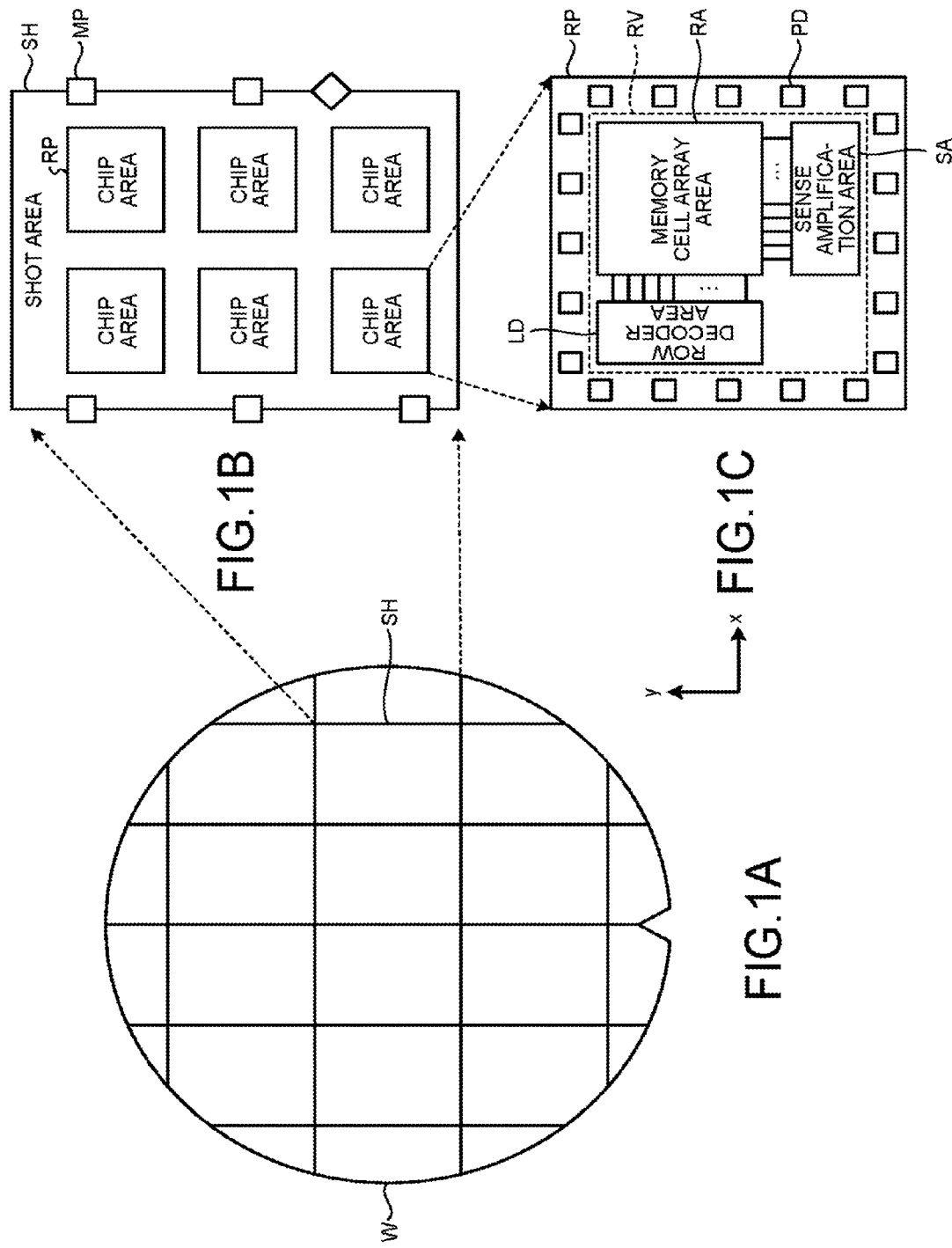

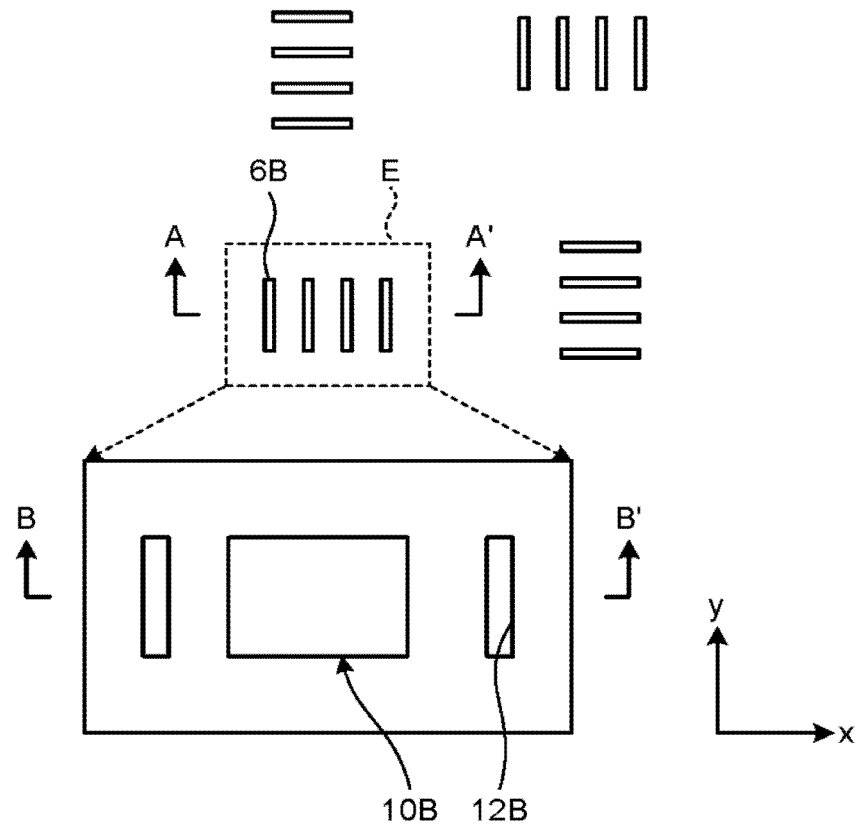

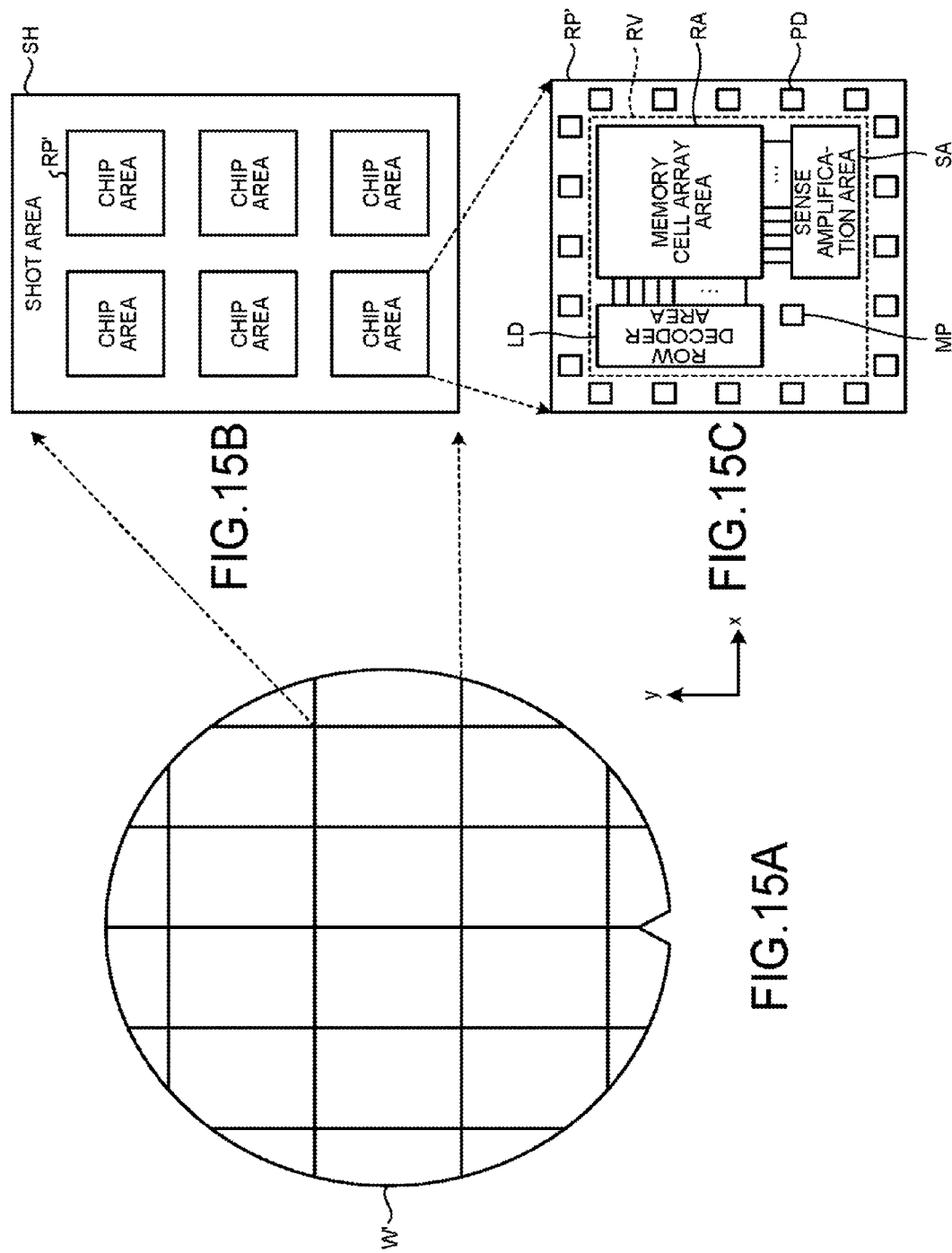

US 9,881,874 B2

FORMING METHOD OF SUPERPOSITION CHECKING MARK, MANUFACTURING METHOD OF A SEMICONDUCTOR DEVICE AND SEMICONDUCTOR DEVICE

CROSS-REFERENCE TO RELATED APPLICATIONS

This application is based upon and claims the benefit of priority from U.S. Provisional Application No. 62/261,449, filed on Dec. 1, 2015; the entire contents of which are incorporated herein by reference.

FIELD

Embodiments described herein relate generally to a forming method of superposition checking marks, a manufacturing method of a semiconductor device, and a semiconductor device.

BACKGROUND

In a lithography process, superposition checking marks are formed on upper and lower layers to perform alignment between patterns formed by use of different masks and check the patterns for misalignment. At that time, when there is an opaque film between the upper and lower layers, the superposition checking mark on the lower layer cannot be recognized at the time of formation of the superposition checking mark on the lower layer.

BRIEF DESCRIPTION OF THE DRAWINGS

FIG. 1A is a planar view illustrating an arrangement example of shot areas to which superposition checking marks are applied according to a first embodiment, FIG. 1B is a planar view illustrating an arrangement example of chip areas arranged in the shot area illustrated in FIG. 1A, and FIG. 1C is a planar view illustrating an arrangement example of a device area arranged in the chip area illustrated in FIG. 1B;

FIG. 3A is a planar view illustrating a layout configuration example of checking mark patterns illustrated in FIG. 2B, and FIG. 3B is a planar view illustrating an example of observation from above an area E illustrated in FIG. 3A after the process described in FIG. 9B;

FIG. 15A is a planar view illustrating an arrangement example of shot areas to which superposition checking marks are applied according to a fifth embodiment, FIG. 15B is a planar view illustrating an arrangement example of chip areas arranged in the shot area illustrated in FIG. 15A, and FIG. 15C is a planar view illustrating an arrangement example of a device area arranged in the chip area illustrated in FIG. 15B.

DETAILED DESCRIPTION

In general, according to one embodiment, a first superposition checking mark is formed to have a first step with respect to an arrangement surface for the first superposition checking mark, an opaque film having a second step resulting from the first step is formed on the arrangement surface, and a second superposition checking mark provided with a transparent film allowing observation of the second step is formed on the opaque film.

Exemplary embodiments of a forming method of superposition checking marks, a manufacturing method a semiconductor device will be explained below in detail with reference to the accompanying drawings. The present invention is not limited to the following embodiments.

First Embodiment

FIG. 1A is a planar view illustrating an arrangement example of shot areas to which superposition checking marks are applied according to a first embodiment, FIG. 1B is a planar view illustrating an arrangement example of chip areas arranged in the shot area illustrated in FIG. 1A, and FIG. 1C is a planar view illustrating an arrangement example of a device area arranged in the chip area illustrated in FIG. 1B. In relation to the following embodiment, the case where a three-dimensional NAND flash memory is formed on a wafer W will be described as an example.

Referring to FIG. 1A, shot areas SH are set on the wafer W. The shot areas SH can correspond to a projection range of a reticle used in a projection exposure device. As illustrated in FIG. 1B, chip areas RP are arranged in each of the shot areas SH, and mark areas MP are arranged around each of the shot areas SH.

As illustrated in FIG. 1C, a device area RV is arranged in each of the chip area RP. The device area RV includes a memory cell array area RA, a row decoder area LD, and a sense amplification area SA. In the memory cell array area RA, memory cells can be arranged three-dimensionally. Pad areas PD are provided around the device area RV.

FIGS. 2A, 4A to 9A, 2B, 4B to 9B, and 10A to 10D are cross-sectional views illustrating a manufacturing method of a semiconductor device to which the superposition checking marks are applied according to the first embodiment. FIGS. 2A, 4A to 9A, and 10A to 10D describe a process for manufacturing the memory cell array area RA illustrated in FIG. 1C, and FIGS. 2B, and 4B to 9B describe a process for manufacturing the mark area MP illustrated in FIG. 1B. FIGS. 10A to 10D describe no process for manufacturing the mark area MP.

Figure 2A:
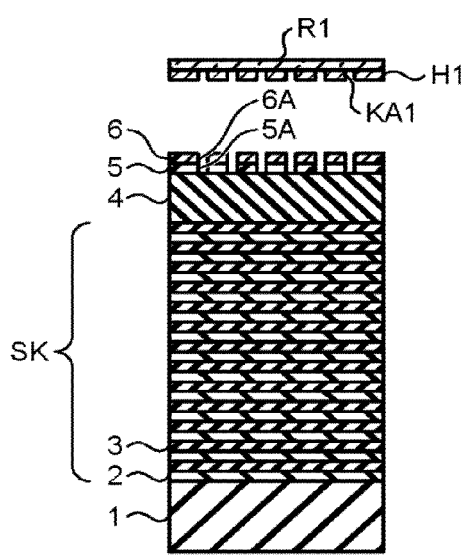
FIGS. 2A and 2B are cross-sectional views illustrating a manufacturing method of a semiconductor device to which the superposition checking marks are applied according to the first embodiment.
Figure 2B:
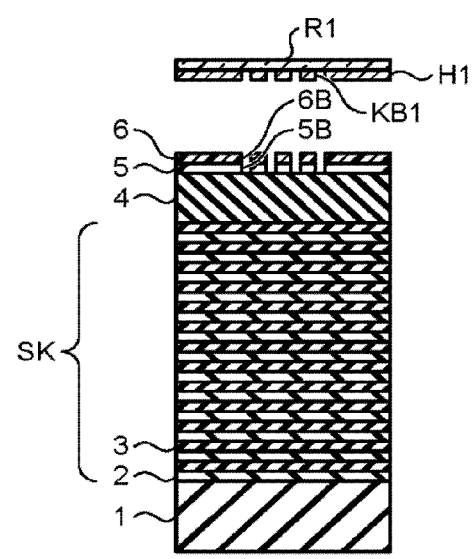

Referring to FIGS. 2A and 2B, a stacked body SK is formed on a foundation layer 1 by a method such as CVD. The foundation layer 1 may be the wafer W itself, an insulation layer, or a semiconductor layer, for example. An integrated circuit or the like for use in the row decoder area LD, the sense amplification area SA, or the like illustrated in FIG. 1C may be formed on the foundation layer 1. The stacked body SK can have a stacked structure in which silicon oxide films 2 and silicon nitride films 3 are alternately stacked.

A hard mask layer 4 is formed on the stacked body SK by a method such as CVD. The hard mask layer 4 may be an amorphous silicon film or a carbon film. Then, an antireflection layer 5 is formed on the hard mask layer 4 by a method such as CVD. The antireflection layer 5 may be a silicon oxide film, a SiOC film, or a SiON film. A resist layer 6 is formed on the antireflection layer 5 by a method such as spin coating.

Then, the wafer W with the resist layer 6 is delivered to an exposure device. A reticle R1 is placed on the exposure device. A light-shielding film H1 is formed on the reticle R1. A hole pattern KA1 is formed on the light-shielding film H1 in the memory cell array area RA. A checking mark pattern KB1 is formed on the light-shielding film H1 in the mark area MP.

The resist layer 6 is exposed to light via the reticle R1 and then is developed. At that time, in the memory cell array area RA, a resist pattern 6A to which the hole pattern KA1 is transferred is formed on the resist layer 6. In the mark area MP, a resist pattern 6B to which the checking mark pattern KB1 is transferred is formed on the resist layer 6.

FIG. 3A is a planar view illustrating a layout configuration example of checking mark patterns illustrated in FIG. 2B. FIG. 2B illustrates a cross section of FIG. 3A along line A-A'.

Referring to FIG. 3A, the resist pattern 6B to which the checking mark pattern KB1 is transferred can be a slit pattern. In this example, a slit pattern arranged in parallel to an x-axis direction and a slit pattern arranged in parallel to a y-axis direction can be combined.

Next, as illustrated in FIGS. 2A and 2B, the antireflection layer 5 is etched via the resist patterns 6A and 6B to form on the antireflection layer 5 opening patterns 5A and 5B to which the resist patterns 6A and 6B are transferred, respectively.

Figure 4A:
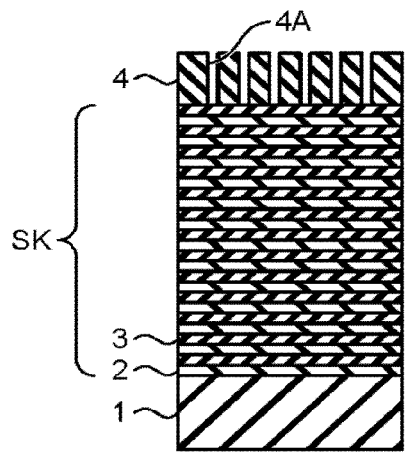
FIGS. 4A and 4B are cross-sectional views illustrating a manufacturing method of a semiconductor device to which the superposition checking marks are applied according to the first embodiment.
Figure 4B:
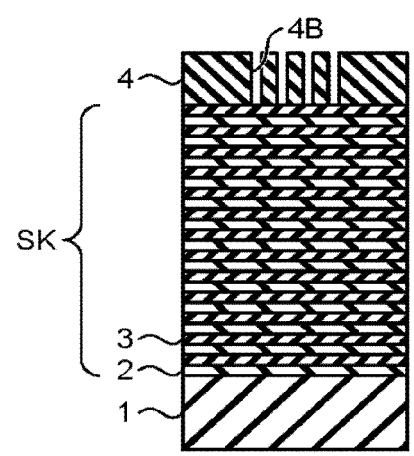

Next, as illustrated in FIGS. 4A and 4B, the hard mask layer 4 is etched via the opening patterns 5A and 5B to form on the hard mask layer 4 opening patterns 4A and 4B to which the opening patterns 5A and 5B are transferred, respectively.

Figure 5A:
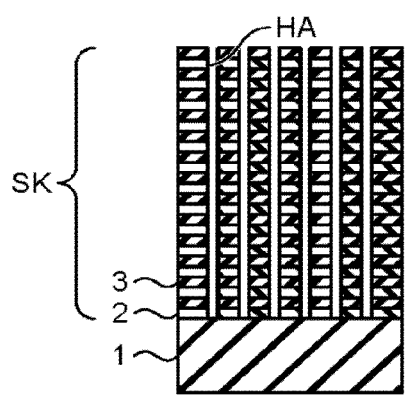
FIGS. 5A and 5B are cross-sectional views illustrating the manufacturing method of a semiconductor device to which the superposition checking marks are applied according to the first embodiment.
Figure 5B:
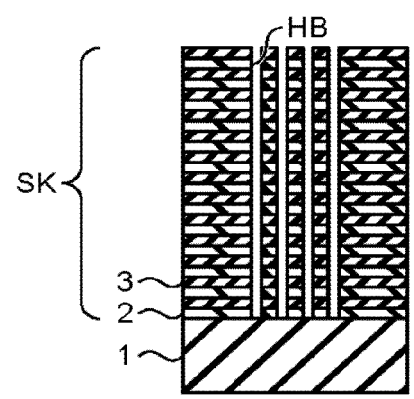

Next, as illustrated in FIGS. 5A and 5B, the stacked body SK is etched via the opening patterns 4A and 4B to form memory holes HA to which the opening pattern 4A is transferred on the stacked body SK in the memory cell array area RA, and form an opening pattern HB to which the opening pattern 4B is transferred on the stacked body SK in the mark area MP. The opening pattern HB can be used as first superposition checking mark.

Figure 6A:
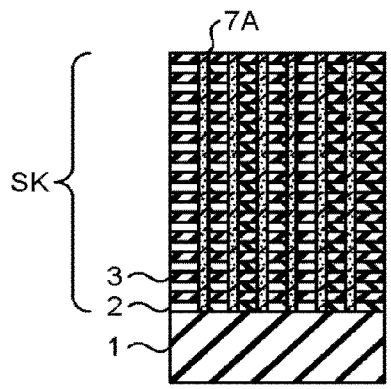
FIGS. 6A and 6B are cross-sectional views illustrating the manufacturing method of a semiconductor device to which the superposition checking marks are applied according to the first embodiment.
Figure 6B:
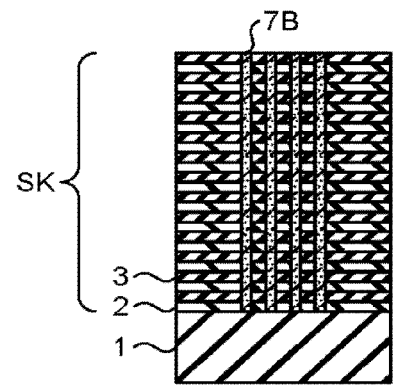

Next, as illustrated in FIGS. 6A and 6B, columnar bodies 7A and 7B are embedded into the memory holes HA and the opening pattern HB by a method such as CVD. The columnar bodies 7A and 7B may be formed of the same material or different materials. The material for the columnar bodies 7B may be different from that for the stacked body SK and may be amorphous silicon, for example.

Figure 7A:
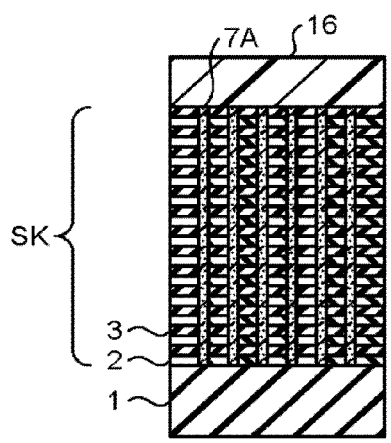
FIGS. 7A and 7B are cross-sectional views illustrating the manufacturing method of a semiconductor device to which the superposition checking marks are applied according to the first embodiment.
Figure 7B:
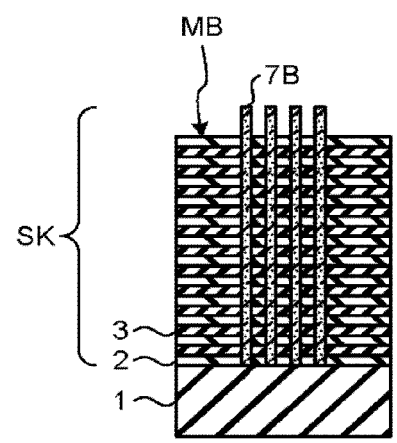

Next, as illustrated in FIGS. 7A and 7B, a resist pattern 16 is formed on the stacked body SK in the memory cell array area RA by use of a photolithography technique. The stacked body SK in the mark area MP is thinned via the resist pattern 16 to protrude the columnar bodies 7B on the stacked body SK. The first superposition checking marks can be stepped with respect to a first superposition checking mark arrangement surface MB.

Figure 8A:
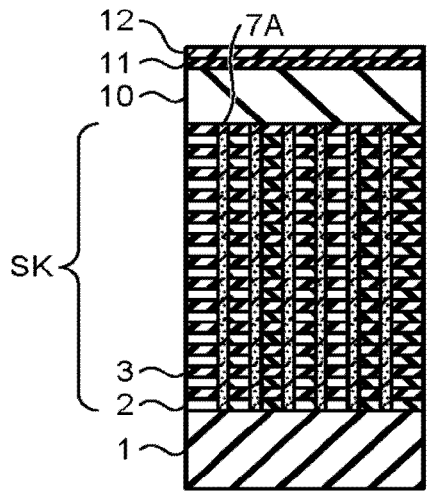
FIGS. 8A and 8B are cross-sectional views illustrating the manufacturing method of a semiconductor device to which the superposition checking marks are applied according to the first embodiment.
Figure 8B:
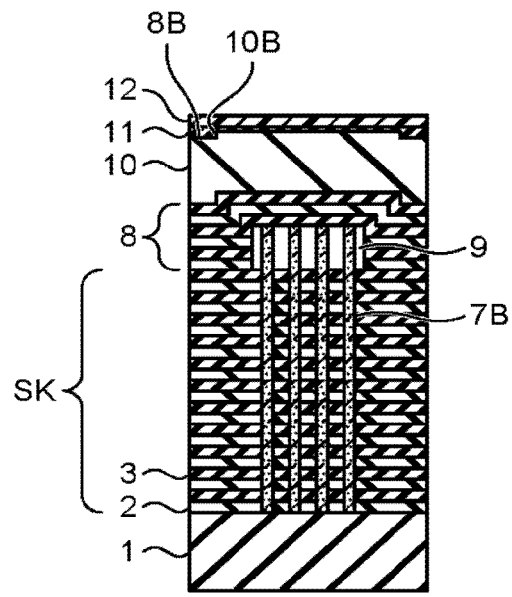

Next, as illustrated in FIGS. 8A and 8B, the resist pattern 16 is removed from the stacked body SK in the memory cell array area RA. A cover layer 8 covering the protruded portions of the columnar bodies 7B is formed in the mark area MP by a method such as CVD. The cover layer 8 may be composed of two or more different kinds of films. For example, the cover layer 8 may have a stacked structure of silicon oxide films and silicon nitride films, for example. At that time, by keeping the cover layer 8 from entering between the protruded portions of the columnar bodies 7B, air gaps 9 can be provided around the protruded portions of the columnar bodies 7B. The cover layer 8 can have a step 8B according to the amount of protrusion of the columnar bodies 7B. The cover layer 8 formed on the stacked body SK in the memory cell array area RA may be selectively removed or may be left on the stacked body SK in the memory cell array area RA. FIG. 8A illustrates the case where the cover layer 8 formed on the stacked body SK in the memory cell array area RA is selectively removed.

Next, an opaque film 10 is formed on the stacked body SK in the memory cell array area RA and on the cover layer 8 in the mark area MP by a method such as CVD. The opaque film 10 can be formed of a carbon film. The opaque film 10 can have a step 10B resulting from the step 8B in the cover layer 8.

The carbon film can be formed by PE-CVD (Plasma Enhanced Chemical Vapor Deposition) method. At that time, a film forming condition called APF (Advanced Patterning Film) can be used, for example. In this film forming condition, a film forming temperature can be set to a high temperature of about 550° C. Material gas may be a hydrocarbon system gas such as methane ($CH_4$), ethane ($C_2H_6$), propane ($C_3H_8$), butane ($C_4H_{10}$), acetylene ($C_2H_2$), propylene ($C_3H_6$), or propyne ($C_3H_4$), for example. Carrier gas may be an inert gas such as helium (He) or argon (Ar).

Alternatively, the opaque film 10 may be formed in the mark area MP without forming the cover layer 8 in the mark area MP.

Next, an antireflection layer 11 is formed on the opaque film 10 by a method such as PVC. The antireflection layer 11 may be a silicon oxide film, a SiOC film, or a SiON film.

A resist layer 12 is formed on the antireflection layer 11 by a method such as spin coating.

Figure 9A:
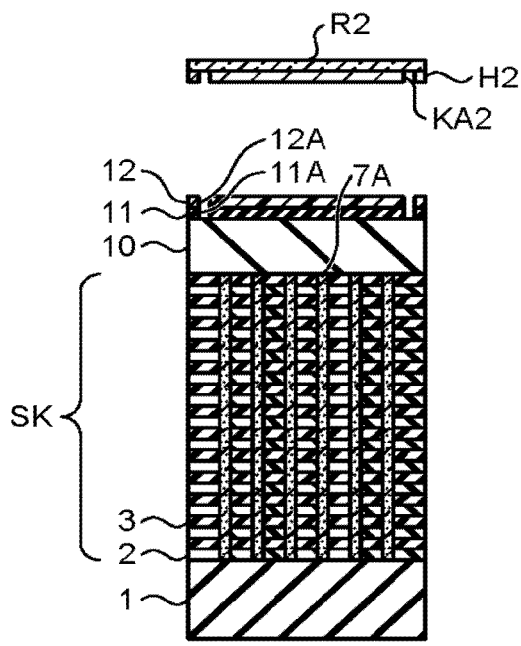
FIGS. 9A and 9B are cross-sectional views illustrating the manufacturing method of a semiconductor device to which the superposition checking marks are applied according to the first embodiment.
Figure 9B:
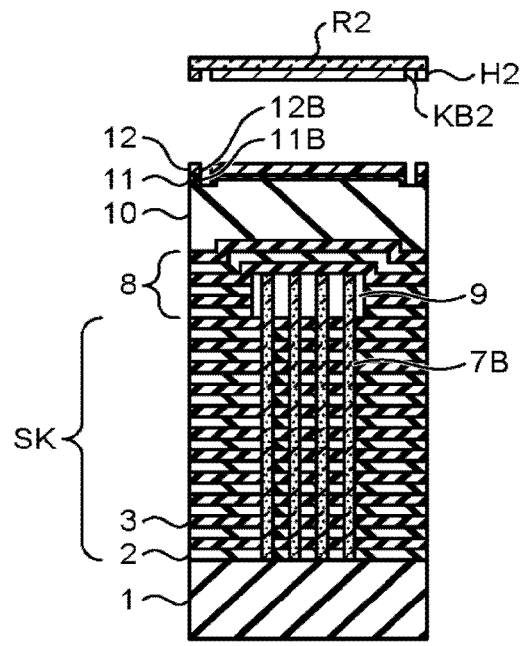

Next, as illustrated in FIGS. 9A and 9B, the wafer W with the resist layer 12 is transferred to an exposure device. A reticle R2 is placed on the exposure device. A light-shielding film H2 is formed on the reticle R2. A slit pattern KA2 is formed on the light-shielding film H2 in the memory cell array area RA. A checking mark pattern KB2 is formed on the light-shielding film H2 in the mark area MP.

The resist layer 12 is exposed to light via the reticle R2 and then is developed. At that time, in the memory cell array area RA, a resist pattern 12A to which the slit pattern KA2 is transferred is formed on the resist layer 12. In the mark area MP, a resist pattern 12B to which the checking mark pattern KB2 is transferred is formed on the resist layer 12. The resist pattern 12B can be used as a second superposition checking mark.

FIG. 3B is a planar view illustrating an example of observation from above an area E illustrated in FIG. 3A after the process described in FIG. 9B. FIG. 9B illustrates a cross section of FIG. 3B along line B-B'.

Referring to FIG. 3B, after the process illustrated in FIG. 9B, the area E illustrated in FIG. 3A is observed front above. The resist pattern 12B and the step 10B of the opaque film 10 can be observed at the same time, and the relative positions of the resist pattern 12B and the step 10B of the opaque film 10 can be measured. The position of the step 10B of the opaque film 10 is defined by the position of the first superposition checking mark. Therefore, by measuring the relative positions of the resist pattern 12B and the step 10B of the opaque film 10, it is possible to determine a misalignment between the first superposition checking mark and the second superposition checking mark. Accordingly, even when the first superposition checking mark cannot be directly observed because the opaque film 10 is formed on the first superposition checking mark, it is possible to check a misalignment between patterns formed by use of the different reticles R1 and R2.

In this example, as the film thickness of the cover layer 8 increases, the position of the step 8B of the cover layer 8 shifts outward, and the position of the step 10B of the opaque film 10 shifts outward accordingly. Therefore, to allow the resist pattern 12B and the step 10B of the opaque film 10 to be observed at the same time, the range in which the slit pattern illustrated in FIG. 3A is arranged or the amount of protrusion of the columnar body 7B can be set according to the film thickness of the cover layer 8 such that the resist pattern 12B and the step 10B of the opaque film 10 fall within the same view plane.

When the relative positions of the resist pattern 12B and the step 10B of the opaque film 10 fall within the range of prescribed values, the antireflection layer 11 is etched via the resist patterns 12A and 12B to form on the antireflection layer 11 opening patterns 11A and 11B to which the resist patterns 12A and 12B are transferred.

Figure 10A:
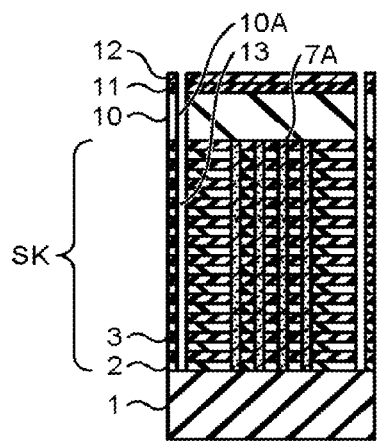
FIGS. 10A to 10D are cross-sectional views illustrating the manufacturing method of a semiconductor device to which the superposition checking marks are applied according to the first embodiment.

Next, as illustrated in FIG. 10A, the opaque film 10 is etched via the opening pattern 11A to form on the opaque film 10 the opening pattern 10A to which the opening pattern 11A is transferred. Then, the stacked body SK is etched via the opening pattern 10A to form a slit pattern 13 to which the opening pattern 10A is transferred on the stacked body SK in the memory cell array area RA. The depth of the slit pattern 13 may reach about 5 to 7 μm. The thickness of the opaque film 10 used as a hard mask at the time of etching may reach about 3 μm.

The use of a carbon film as the opaque film 10 makes it possible to remove easily the opaque film 10 by ashing even when the opaque film 10 is made thick, and suppress damage to the device area RV.

In addition, the use of a carbon film as the opaque film 10 allows the opaque film 10 to be conductive. Accordingly, it is possible to suppress charge-up of the opaque film 10 and dielectric breakdown of the opaque film 10 even when a gate insulation film or the like is formed in the device area RV.

Figure 10B:
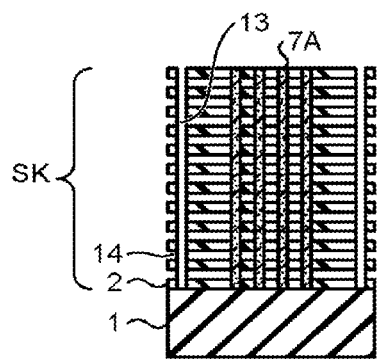

Next, as illustrated in FIG. 10B, the silicon nitride films 3 are selectively etched by a method such as wet etching to remove the silicon nitride films 3 and form air gaps 14 between the silicon oxide films 2. In this example, the silicon nitride films 3 can be selectively etched by entering an etching agent such as an etching solution into the stacked body SK via the slit pattern 13.

Figure 10C:
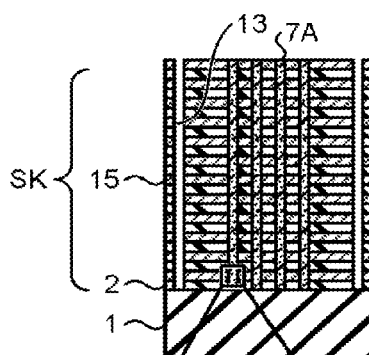

Next, as illustrated in FIG. 10C, conductive films 15 are embedded into the air gaps 14 by a method such as ALD-CVD. The material for the conductive films 15 may be tungsten or impurity-doped amorphous silicon, for example. The conductive films 15 can be used for word lines.

Figure 10D:
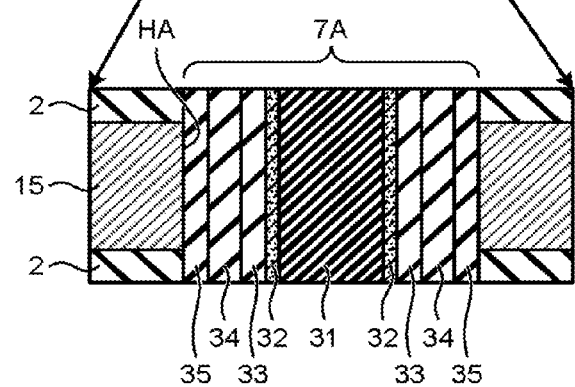

As illustrated in FIG. 10D, a columnar insulator 31 is formed at the center of the columnar body 7A. A channel layer 32 is formed between the inner surface of the memory hole HA and the columnar insulator 31. A tunnel insulation film 33 is formed between the inner surface of the memory hole HA and the channel layer 32. A charge trap layer 34 is formed between the inner surface of the memory hole HA and the tunnel insulation film 33. A block insulation film 35 is formed between the inner surface of the memory hole HA and the charge trap layer 34. The channel layer 32 may be a polysilicon film or an amorphous silicon film, for example. The columnar insulator 31, the tunnel insulation film 33, and the block insulation film 35 may be silicon oxide films, for example. The charge trap layer 34 may be a silicon nitride film or an ONO film (three-layer structure of silicon oxide film/silicon nitride film/silicon oxide film), for example.

Figure 11:
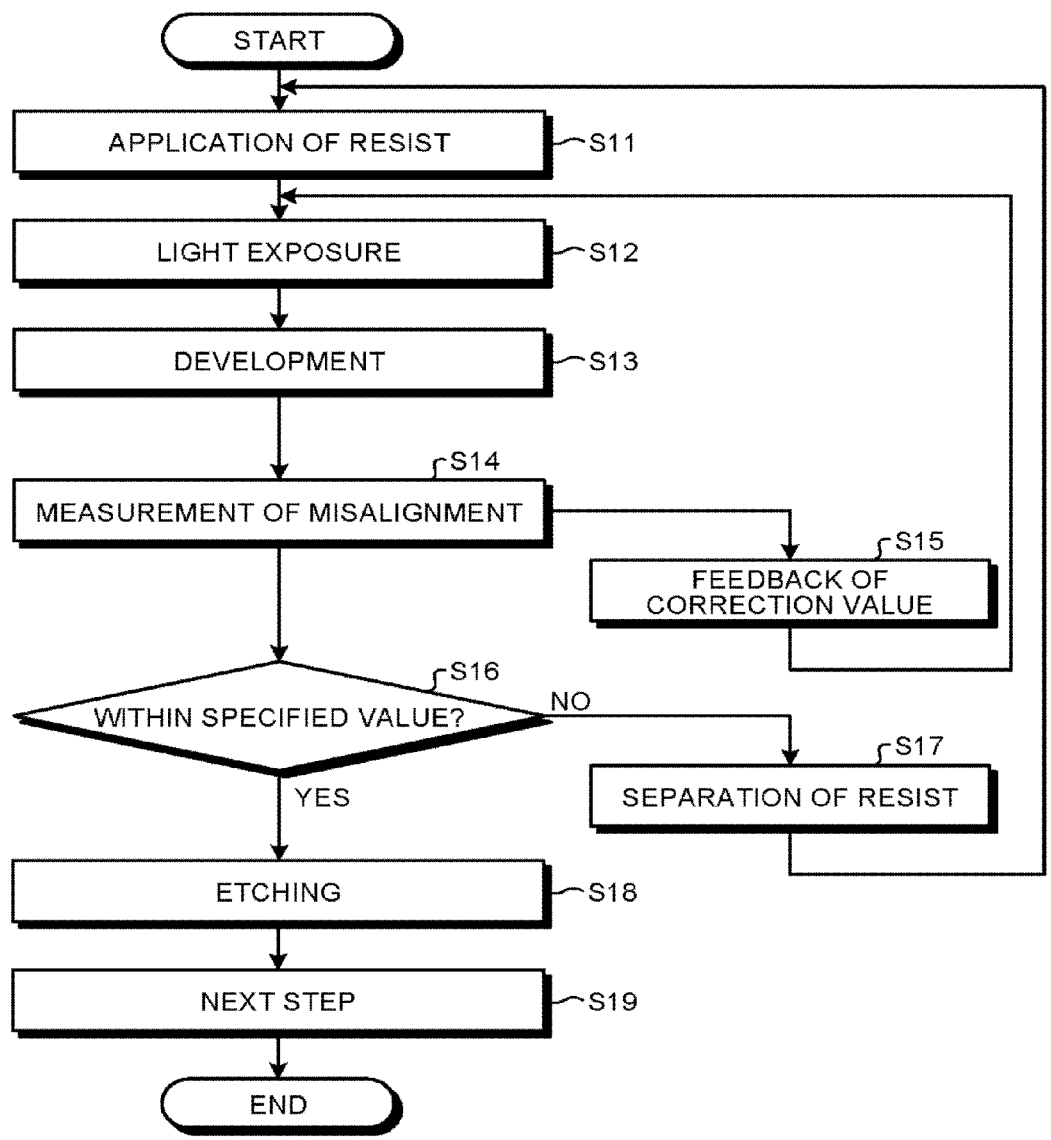
FIG. 11 is a flowchart of a manufacturing method of a semiconductor device to which the superposition checking marks are applied according to the first embodiment.

FIG. 11 is a flowchart of a manufacturing method of a semiconductor device to which the superposition checking marks are applied according to the first embodiment.

Referring to FIG. 11, the resist layer 12 is applied to the wafer W with the opaque film 10 (S11). At that time, the opaque film 10 has the step 10B. The reticle R2 and the wafer W is loaded on an exposure device, and the resist layer 12 on the wafer W is irradiated with exposure light to expose the resist layer 12 on the wafer W to light (S12). The resist layer 12 is developed to form the resist patterns 12A and 12B on the wafer W (S13). The wafer W with the resist patterns 12A and 12B is loaded on a misalignment checking device. The relative positions of the resist pattern 12B and the step 10B of the opaque film 10 are measured by the misalignment checking device to determine a misalignment between the first superposition checking mark and the second superposition checking mark (S14).

Next, the correction values for exposure conditions are calculated such that the misalignment comes close to zero, and is fed back to the exposure device (S15). It is determined whether the misalignment falls within a prescribed value (S16). When the misalignment does not fall within the prescribed value, the resist layer 12 is removed (S17) and then the process returns to S11. Steps S11 to S17 are repeated until the misalignment falls within the prescribed value. When the misalignment falls within the prescribed value, the opaque film 10 is etched via the resist patterns 12A and 12B (S18), and then the process moves to the next step (S19).

In the embodiment described above, the stacked body SK has the stacked structure in which the silicon oxide films 2 and the silicon nitride films 3 are alternately stacked as an example. Alternatively, the stacked body SK may have a stacked structure of two or more kinds of films. For example, the stacked body SK may have a stacked structure in which insulators such as silicon oxide films and conductors such as impurity-added silicon layers are alternately stacked. The impurity-added silicon layers can be used as word lines. For this stacked structure, the processes FIGS. 10B and 10C can be omitted.

Alternatively, the stacked body SK may have a stacked structure in which non-impurity-added layers and impurity-added silicon layers are alternately stacked. The impurity-added silicon layers can be used as word lines. For this stacked structure, the non-impurity-added silicon layer can be selectively removed in the process described in FIG. 10B. Further, insulators such as silicon oxide films can be embedded into air gaps produced at the time of removal of the non-impurity-added silicon layer in the process of FIG. 10C.

Second Embodiment

Figure 12:
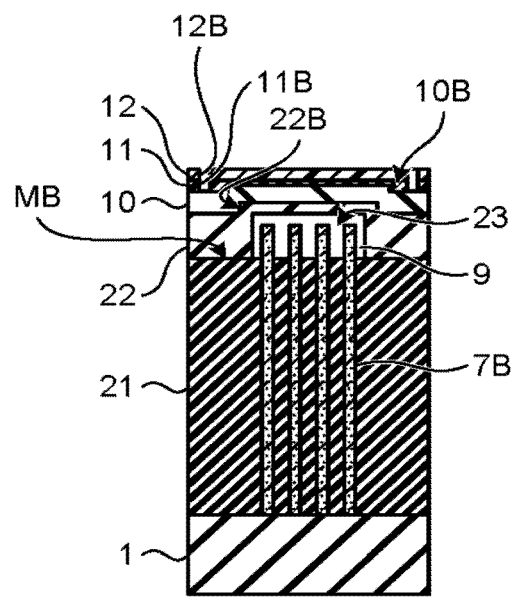
FIG. 12 is a cross-sectional view illustrating a manufacturing method of a semiconductor device to which superposition checking marks are applied according to a second embodiment.

FIG. 12 is a cross-sectional view illustrating a manufacturing method of a semiconductor device to which superposition checking marks are applied according to a second embodiment. FIG. 12 illustrates an extract of the process corresponding to the mark area MP from FIG. 9B.

Referring to FIG. 12, in the mark area MP, an inter-layer insulation film 21 is provided instead of the stacked body SK illustrated in FIG. 9B. The inter-layer insulation film 21 may be formed around the memory cell array area RA in the chip area RP. A cover layer 22 is provided instead of the cover layer 8 illustrated in FIG. 9B. The inter-layer insulation film 21 and the cover layer 22 may be silicon oxide films, for example. The columnar bodies 7B protrude on the inter-layer insulation film 21. The material for the columnar bodies 7B may be different from the material for the inter-layer insulation film 21. For example, the material for the columnar bodies 7B may be an amorphous silicon, a silicon nitride film, or the same as the material for the columnar bodies 7A. The columnar bodies 7B are covered with the cover layer 22. Under the cover layer 22, air gaps 23 are provided around the protruded portions of the columnar bodies 7B. The cover layer 22 has a step 22B formed according to the amount of protrusion of the columnar bodies 7B. The opaque film 10 has the step 10B resulting from the step 22B of the cover layer 22.

In this example, by providing the inter-layer insulation film 21 instead of the stacked body SK illustrated in FIG. 9B, the layer structure for forming the superposition checking marks and the layer structure for forming the device patterns can be different from each other. Accordingly, the layer structure suited for forming the superposition checking marks can be employed with any layer structure for forming the device patterns.

Third Embodiment

Figure 13:
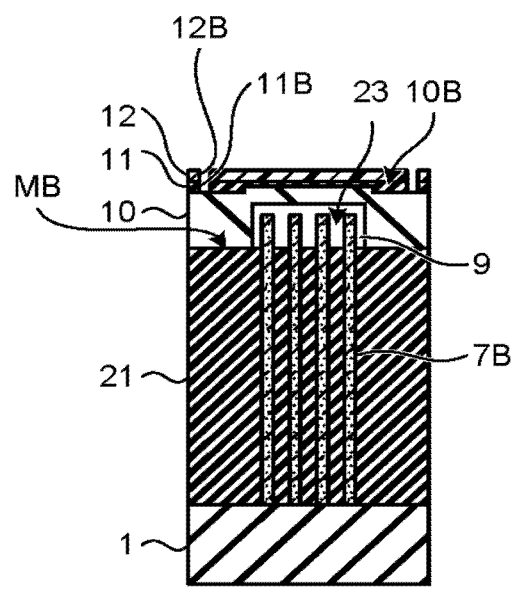
FIG. 13 is a cross-sectional view illustrating a manufacturing method of a semiconductor device to which superposition checking marks are applied according to a third embodiment.

FIG. 13 is a cross-sectional view illustrating a manufacturing method of a semiconductor device to which superposition checking marks are applied according to a third embodiment. FIG. 13 illustrates an extract of the process corresponding to the mark area MP illustrated in FIG. 9B.

The configuration of FIG. 13 does not have the cover layer 22 illustrated in FIG. 12. The columnar bodies 7B can be covered with the opaque film 10. The opaque film 10 has the step 10B formed according to the amount of protrusion of the columnar bodies 7B. Eliminating the cover layer 22 of FIG. 12 can decrease the processes in number.

Fourth Embodiment

Figure 14:
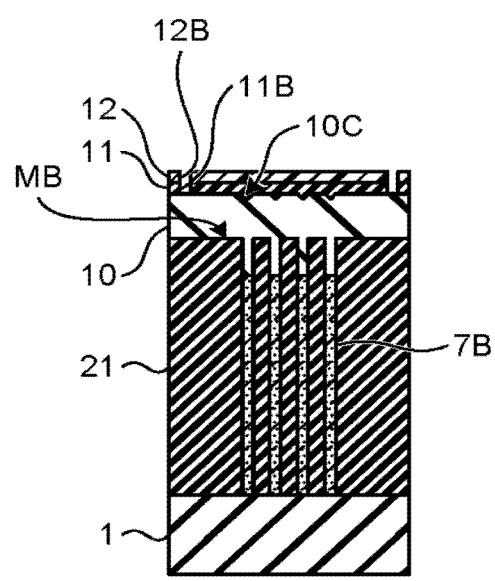
FIG. 14 is a cross-sectional view illustrating a manufacturing method of a semiconductor device to which superposition checking marks are applied according to a fourth embodiment.

FIG. 14 is a cross-sectional view illustrating a manufacturing method of a semiconductor device to which superposition checking marks are applied according to a fourth embodiment. FIG. 14 illustrates an extract of the process corresponding to the mark area MP illustrated in FIG. 9B.

In the configuration of FIG. 13, the columnar bodies 7B protrude on the inter-layer insulation film 21, whereas in the configuration of FIG. 14, the columnar bodies 7B are recessed inward the inter-layer insulation film 21. In this example, the first superposition checking mark can be provided with a step on the first superposition checking mark arrangement surface MP. The opaque film 10 is formed on the inter-layer insulation film 21 to cover the columnar bodies 7B. The opaque film 10 has a step 10C formed according to the amount of recession of the columnar bodies 7B. In this example, it is possible to observe the resist pattern 12B and the step 10C of the opaque film 10 at the same time and measure the relative positions of the resist pattern 12B and the step 10C of the opaque film 10.

Fifth Embodiment

FIG. 15A is a planar view illustrating an arrangement example of shot areas to which superposition checking marks are applied according to a fifth embodiment, FIG. 15B is a planar view illustrating an arrangement example of chip areas arranged in the shot area illustrated in FIG. 15A, and FIG. 15C is a planar view illustrating an arrangement example of a device area arranged in the chip area illustrated in FIG. 15B.

Referring to FIG. 15A, shot areas SH are set on a wafer W'. As illustrated in FIG. 15B, chip areas RP' are arranged in each of the shot areas SH. As illustrated in FIG. 15C, a device area RV is provided in each of the chip areas RP'. The device area RV includes a memory cell array area RA, a row decoder area LD, and a sense amplification area SA. A mark area MP is arranged in the chip area RP'. The mark area MP can be arranged adjacent to the memory cell array area RA. Pad areas PD are provided around the device area RV.

In this example, by arranging the mark area MP in the chip area RP', the mark area MP can be positioned close to the memory cell array area RA. This makes it possible to reflect on the mark area MP a misalignment in the memory cell array area RA resulting from a stress or the like. As a result, by checking a misalignment between the superposition checking marks in the mark area MP, it is possible to improve the accuracy of checking a misalignment between device patterns in the memory cell array area RA.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A forming method of superposition checking marks, comprising:
   forming a first superposition checking mark to have a first step with respect to an arrangement surface for the first superposition checking mark;
   forming an opaque film covering the first superposition checking mark and the first step to have a second step resulting from the first step on the arrangement surface; and forming on the opaque film a second superposition checking mark provided with a transparent film allowing observation of the second step.

2. A forming method of superposition checking marks, comprising:
   forming a first superposition checking mark to have a first step with respect to an arrangement surface for the first superposition checking mark;
   forming an opaque film having a second step resulting from the first step on the arrangement surface; and
   forming on the opaque film a second superposition checking mark provided with a transparent film allowing observation of the second step, wherein
   the first superposition checking mark protrudes on the arrangement surface.

3. The forming method of superposition checking marks of claim 2, comprising forming under the opaque film a cover film that is arranged on the arrangement surface to cover the first superposition checking mark and has a third step resulting from the first step.

4. The forming method of superposition checking marks of claim 3, wherein in the forming of the first superposition checking mark, a range of a mark area or an amount of protrusion of a columnar body is set according to a thickness of the cover film.

5. The forming method of superposition checking marks of claim 3, comprising forming under the cover film air gaps around the protruded portion of the first superposition checking mark.

\* \* \* \* \*